United States Patent
Fujita et al.

(10) Patent No.: US 10,658,268 B2
(45) Date of Patent: May 19, 2020

(54) SEMICONDUCTOR DEVICE

(71) Applicant: Mitsubishi Electric Corporation, Tokyo (JP)

(72) Inventors: Shigeto Fujita, Tokyo (JP); Tetsuya Matsuda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/095,461

(22) PCT Filed: Sep. 9, 2016

(86) PCT No.: PCT/JP2016/076649
§ 371 (c)(1),
(2) Date: Oct. 22, 2018

(87) PCT Pub. No.: WO2018/047300
PCT Pub. Date: Mar. 15, 2018

(65) Prior Publication Data
US 2019/0189538 A1    Jun. 20, 2019

(51) Int. Cl.
*H01L 23/48* (2006.01)
*H01L 25/07* (2006.01)
*H01R 11/01* (2006.01)
*H01L 29/20* (2006.01)
*H01L 25/18* (2006.01)

(52) U.S. Cl.
CPC ............ *H01L 23/481* (2013.01); *H01L 23/48* (2013.01); *H01L 25/07* (2013.01); *H01L 25/074* (2013.01);
(Continued)

(58) Field of Classification Search
CPC ....... H01L 24/71; H01L 24/72; H01L 23/481; H01L 23/62
See application file for complete search history.

(56) References Cited

U.S. PATENT DOCUMENTS 5,705,853 A    1/1998  Faller et al.
6,320,268 B1 *  11/2001  Lang ................. H01L 24/72
                                                257/177
(Continued)

FOREIGN PATENT DOCUMENTS

JP    S63-211526 A    9/1988
JP    H09-107068 A    4/1997
(Continued)

OTHER PUBLICATIONS

International Search Report issued in PCT/JP2016/076649; dated Nov. 8, 2016.
(Continued)

*Primary Examiner* — Victoria K. Hall
(74) *Attorney, Agent, or Firm* — Studebaker & Brackett PC

(57) ABSTRACT

A lower electrode, a semiconductor chip provided on the lower electrode, a pressure pad provided above or below the semiconductor chip, an upper electrode provided on a structure in which the pressure pad is overlapped with the semiconductor chip, and a connection conductor that provides a new current path between the lower electrode and the upper electrode only when a distance between the lower electrode and the upper electrode becomes larger than a predetermined value are provided. The distance between the lower electrode and the upper electrode is variable, and the pressure pad electrically connects the lower electrode and the upper electrode together via the semiconductor chip regardless of the distance between the lower electrode and the upper electrode.

12 Claims, 7 Drawing Sheets

(52) U.S. Cl.
CPC .......... *H01L 25/18* (2013.01); *H01L 29/2003* (2013.01); *H01R 11/01* (2013.01)

(56) References Cited

U.S. PATENT DOCUMENTS

| | | | |
|---|---|---|---|
| 2004/0207070 A1 | 10/2004 | Kaufmann et al. | |
| 2013/0043578 A1* | 2/2013 | Dugal | H01L 23/62 257/690 |
| 2016/0071998 A1* | 3/2016 | Nakano | H01L 31/12 257/77 |

FOREIGN PATENT DOCUMENTS

| | | |
|---|---|---|
| JP | 2000-223658 A | 8/2000 |
| JP | 2004-528724 A | 9/2004 |
| JP | 2009-043775 A | 2/2009 |
| JP | 2013-048239 A | 3/2013 |
| JP | 2013-089893 A | 5/2013 |
| JP | 2014-157924 A | 8/2014 |

OTHER PUBLICATIONS

Written Opinion issued in PCT/JP2016/076649; dated Nov. 8, 2016.
Notification of Transmittal of the International Search Report and the Written Opinion of the International Searching Authority, or the Declaration issued in PCT/JP2016/076649; dated Nov. 8, 2016.
An Office Action mailed by the Japanese Patent Office dated Nov. 12, 2019, which corresponds to Japanese Patent Application No. 2018-537952 and is related to U.S. Appl. No. 16/095,461; with English language translation.

* cited by examiner

SEMICONDUCTOR DEVICE

FIELD

The present invention relates to a semiconductor device used, for example, switching large current.

BACKGROUND

Patent Literature 1 discloses a press-pack power semiconductor device. Patent Literature 1 discloses, in FIG. 1, a press-pack power semiconductor device having a plurality of semiconductor chips inside. The semiconductor chip is, for example, an IGBT. Electric connection in the semiconductor chip is realized by press contact of the upper surfaces and the lower surfaces of individual elements of the semiconductor device. In order to evenly exert pressure on the plurality of semiconductor chips, there are needed a spring structure and play in an electric conduction path for each semiconductor chip.

A pressure pad affords this play and secures the electric connection. A plurality of pressure pads are occasionally provided in order to increase current-carrying capacity for normal current. A spring is occasionally provided between the pressure pads, this spring functions as an inductance even when it has conductivity, and it has high impedance particularly for high frequency waves. Therefore, current does not flow through the spring.

PRIOR ART

Patent Literature

Patent Literature 1: JP 2004-528724 A

SUMMARY

Technical Problem

When short circuit arises in a press-pack semiconductor device, explosion of the device is concerned. For example, by short circuit current flowing through a pressure pad, the pressure pad melts and breaks due to Joule heat generation to cause an electric arc. Then, an electricity path inside the device breaks to cause an electric arc at the site of breaking, and due to heat of the electric arc, an atmosphere therein expands or a solid therein is vaporized to cause its explosion.

A robust explosion-proof structure provided in the device with explosion as above taken into consideration has been a factor of prohibiting downsizing and low costs of the device. There have been occasionally needed restriction of a region of service current and/or separately providing a short-circuit protection.

The present invention is devised in order to solve the aforementioned problems, and an object thereof is to provide a semiconductor device capable of preventing a pressure pad from melting and breaking.

Means for Solving the Problems

According to a present invention, a semiconductor device includes a lower electrode, a semiconductor chip provided on the lower electrode, a pressure pad provided above or below the semiconductor chip, an upper electrode provided on a structure in which the pressure pad is overlapped with the semiconductor chip, and a connection conductor that provides a new current path between the lower electrode and the upper electrode only when a distance between the lower electrode and the upper electrode becomes larger than a predetermined value, wherein the distance between the lower electrode and the upper electrode is variable, and the pressure pad electrically connects the lower electrode and the upper electrode together via the semiconductor chip regardless of the distance between the lower electrode and the upper electrode.

According to another aspect of the present invention, a semiconductor device includes a lower electrode, an upper electrode provided above the lower electrode, a semiconductor chip provided between the lower electrode and the upper electrode, a metal block provided between the lower electrode and the upper electrode to be overlapped with the semiconductor chip, and two pressure pads provided between the lower electrode and the upper electrode, the two pressure pads are configured for electrically connecting the lower electrode and the upper electrode together via the semiconductor chip, and provided to face each other, allowing the metal block to be interposed between the two pressure pads, wherein when current flowing through the two pressure pads becomes larger than a predetermined value, a distance between the two pressure pads decreases, and a contact area of the two pressure pads with a lateral surface of the metal block increases.

Advantageous Effects of Invention

According to the present invention, a pressure pad can be prevented from melting and breaking by reducing short circuit current loaded on the pressure pad and/or enhancing heat dissipation of the pressure pad.

DESCRIPTION OF EMBODIMENTS

Semiconductor devices according to embodiments of the present invention are described with reference to the drawings. The same or corresponding components are given the same signs and their duplicate description is occasionally omitted.

Embodiment 1

Figure 1:
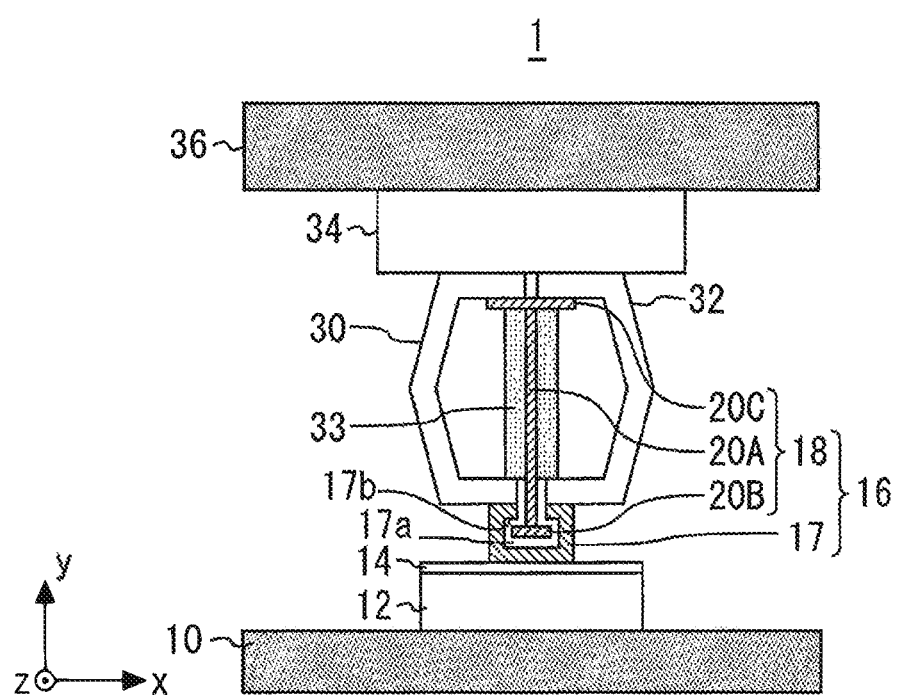
FIG. 1 is a cross-sectional view of a semiconductor device according to Embodiment 1.

FIG. 1 is a cross-sectional view of a semiconductor device 1 according to Embodiment 1. This semiconductor device 1 includes a lower electrode 10. A semiconductor chip 12 is provided on the lower electrode 10. The semiconductor chip 12 is, for example, an IGBT or a diode. A plate 14 formed of metal is provided on the semiconductor chip 12.

A structure having a connection conductor 16 and pressure pads 30 and 32 is provided on the plate 14. The connection conductor 16 has a first portion 17 and a second portion 18. The first portion 17 is a portion which is fixed to the lower electrode 10 by being fixed to the plate 14 and interlockingly moves with the lower electrode 10. A hollow 17a is formed in the first portion 17. Thereby, an inner wall upper surface 17b exists therein.

The second portion 18 includes a linear conductor 20A, an upper end part 20C which is a horizontally long conductor provided at the upper end of the linear conductor 20A, and a lower end part 20B which is a horizontally long conductor provided at the lower end of the linear conductor 20A. The linear conductor 20A and the lower end part 20B form a reverse T-shape. The linear conductor 20A is a conductor extending downward from the top of an opening of the first portion 17 by penetrating the opening. Since the lower end of the linear conductor 20A is positioned in the hollow 17a, the lower end part 20B is also positioned in the hollow 17a. As a result, the lower end part 20B is positioned below the upper end of the first portion 17.

The pressure pads 30 and 32 constitute a spring electrode of a press-pack power semiconductor device. A plate 34 is provided on the pressure pads 30 and 32, and an upper electrode 36 is provided on the plate 34. The upper ends of the pressure pads 30 and 32 are fixed to the plate 34, and the lower ends thereof are fixed to the upper surface of the first portion 17. The pressure pads 30 and 32 can expand and contract in the y-direction, that is, in the direction perpendicular to the lower surface of the lower electrode 10 and the upper surface of the upper electrode 36. Therefore, the pressure pads 30 and 32 electrically connect the lower electrode 10 and the upper electrode 36 together via the semiconductor chip 12 regardless of the distance between the lower electrode 10 and the upper electrode 36.

A spring 33 is provided between the pressure pads 30 and 32. This spring 33 exerts force which makes the distance between the lower electrode 10 and the upper electrode 36 small when the distance between the lower electrode 10 and the upper electrode 36 increases, and exerts force which makes the distance between the lower electrode 10 and the upper electrode 36 large when the distance between the lower electrode 10 and the upper electrode 36 decreases.

The aforementioned upper end part 20C of the connection conductor 16 is mechanically and electrically connected to the inner wall upper surfaces of the pressure pads 30 and 32. Accordingly, the second portion 18 is fixed to the upper electrode 36 via the pressure pads 30 and 32 and the plate 34 and interlockingly moves with the upper electrode 36.

FIG. 1 is a cross-sectional view of the semiconductor device in the state where current does not flow through the semiconductor chip 12. In the state where current does not flow through the semiconductor chip 12, the first portion 17 and the second portion 18 are not in contact with each other. Moreover, also in normal operation of the semiconductor device, the first portion 17 and the second portion 18 are not in contact with each other. Accordingly, in the case where current does not flow through the semiconductor chip 12, and in the case of the semiconductor device normally operating, current flows through the pressure pads 30 and 32 and does not flow through the second portion 18.

Figure 2:
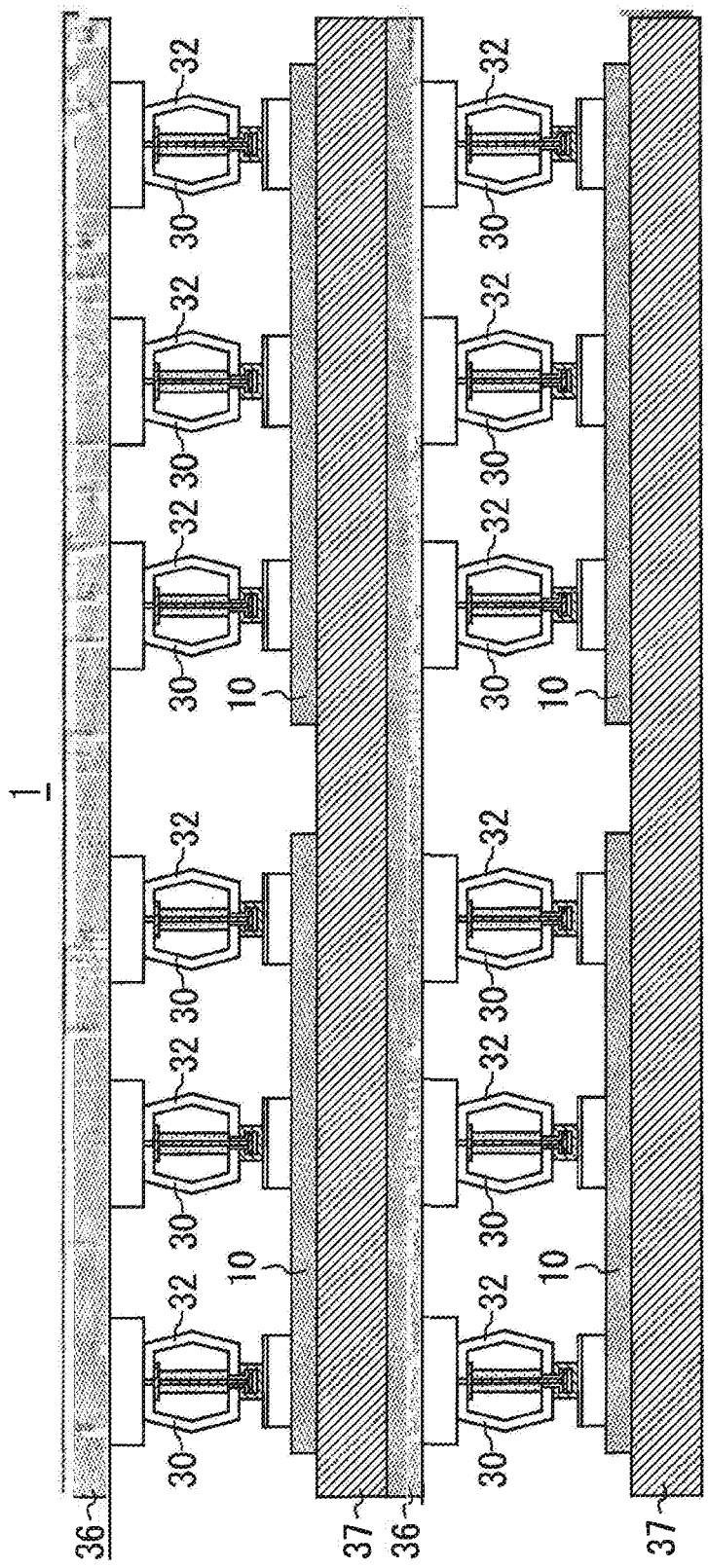
FIG. 2 is a diagram exemplarily illustrating assembly of the semiconductor device according to Embodiment 1.

FIG. 2 is a diagram exemplarily illustrating assembly of the semiconductor device 1 according to Embodiment 1. Three semiconductor devices 1 share one lower electrode 10. Six semiconductor devices 1 are arranged on a base plate 37. FIG. 2 illustrates stacking two structures in each of which twelve semiconductor devices 1 are mounted on the base plate 37. FIG. 2 illustrates a press-pack power semiconductor device constituted of the twelve semiconductor devices 1. Force is exerted on this device from the top and the bottom of the device, and the individual elements in the device are brought into press contact with one another, and thereby, electric connections in the semiconductor chips are realized.

In order to evenly exert pressure on the plurality of semiconductor chips 12, there are needed a spring structure and play in an electric conduction path for each semiconductor device 1. The pressure pads 30 and 32 afford this play and secure the electric connection. Three or more pressure pads for one semiconductor device may be provided in order to increase the current-carrying capacity for normal current. Notably, since the spring 33 between the pressure pads 30 and 32 functions as an inductance even when it has conductivity, it has high impedance particularly for high frequency waves, and current does not flow through the spring 33.

Figure 3:
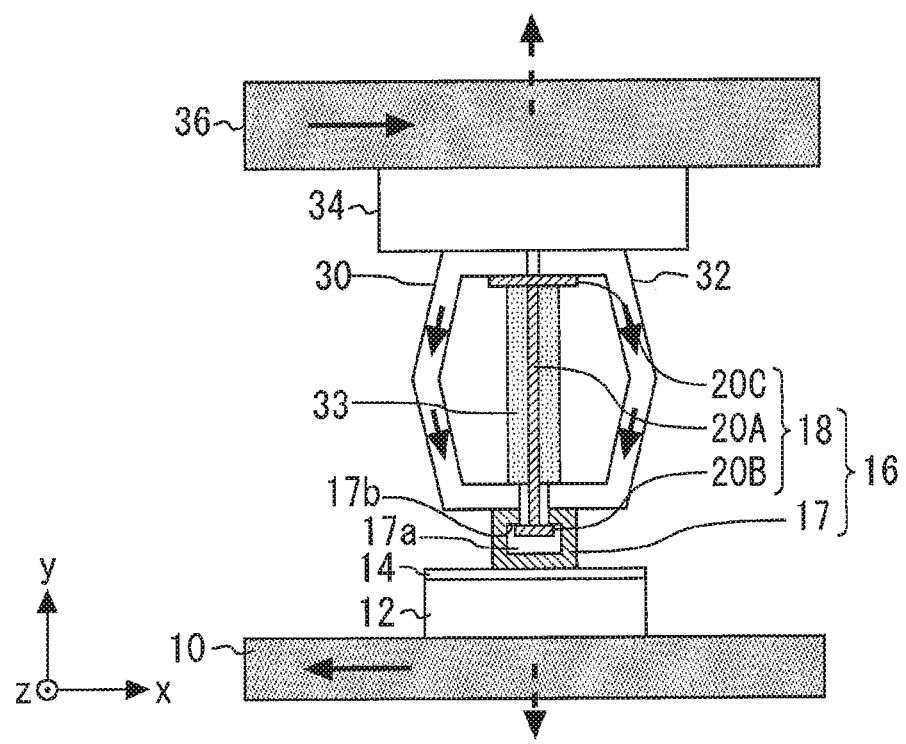
FIG. 3 is a cross-sectional view of the semiconductor device in short circuit.

FIG. 3 is a cross-sectional view of the semiconductor device 1 in short circuit. Solid arrows indicate directions of short circuit currents. Short circuit currents in the opposite directions flow through the upper electrode 36 which is an upper bus bar and the lower electrode 10 which is a lower bus bar. These short circuit currents cause repulsive force to arise between the upper electrode 36 and the lower electrode 10. This repulsive force causes the lower end part 20B of the second portion 18 to move upward in the hollow 17a. Then, when the distance between the lower electrode 10 and the upper electrode 36 becomes larger than a predetermined value, the lower end part 20B comes into contact with the first portion 17. Specifically, the upper surface of the lower end part 20B comes into contact with the inner wall upper surface 17b of the first portion 17. Thus, only when the distance between the lower electrode 10 and the upper electrode 36 becomes larger than the predetermined value, the connection conductor 16 provides a new current path between the lower electrode 10 and the upper electrode 36.

Now, for contact of the lower end part 20B with the first portion 17 when the short circuit currents flow, the normal distance between the lower end part 20B and the inner wall upper surface 17b of the first portion is set to be slightly smaller than an increase in distance between the upper electrode 36 and the lower electrode 10 due to short circuit.

Since in Embodiment 1 of the present invention, current can be caused to flow not only through the pressure pads 30 and 32 but also through the connection conductor 16 in the case of the short circuit state, currents flowing through the pressure pads 30 and 32 can be reduced, and a temperature increase of the pressure pads 30 and 32 can be reduced. Therefore, the pressure pads 30 and 32 can be prevented from melting and breaking. Accordingly, since the semiconductor device according to Embodiment 1 of the present invention is not to explode, an explosion-proof measure conventionally provided can be removed, which can realize downsizing and low costs of the device.

Moreover, in Embodiment 1 of the present invention, the lateral surface of the first portion 17 and the lateral surface of the second portion 18 are separate from each other at all times. Therefore, there can be prevented a problem such as occurrence of an electric arc due to insufficient electric contact in normal operation. Moreover, since the spring 33 is provided, the upper electrode 36 and the lower electrode 10 do not become too separate from each other. Therefore, there can also be expected an effect of preventing peeling-off of a component in the semiconductor device in the longitudinal direction of the second portion 18 due to excess force exerted on the second portion 18 caused by the upper electrode 36 and the lower electrode 10 being too separate from each other. Notably, an insulating film is preferably formed, for example, on at least one of the lateral surface of the linear conductor 20A, the lateral surfaces of the pressure pads 30 and 32, and the lateral surface of the first portion 17 to prevent occurrence of an electric arc.

As above, in Embodiment 1 of the present invention, focusing on that the distance between the lower electrode 10 and the upper electrode 36 changes depending on the presence or absence of a short circuit current, only when the distance between the lower electrode 10 and the upper electrode 36 becomes larger than a predetermined value, the connection conductor 16 provides a new current path between the lower electrode 10 and the upper electrode 36. Various modifications of the connection conductor 16 and the like may occur as long as they do not lose the features thereof. For example, the linear conductor 20A and the lower end part 20B are not needed to form a T-shape but they may form an L-shape. Moreover, the lower end part 20B is to rise in short circuit, and in that case, the upper surface of the lower end part 20B may come into contact with the lower surfaces of the pressure pads 30 and 32.

While the pressure pads 30 and 32 are provided above the semiconductor chip 12, the stacking order of those may be reversed, so that the pressure pads 30 and 32 may be provided below the semiconductor chip 12. The upper electrode 36 is provided above a structure in which the pressure pads 30 and 32 are overlapped with the semiconductor chip 12. There may be any stacking order of the individual elements between the lower electrode 10 and the upper electrode 36 as long as the structure in which the pressure pads 30 and 32 are overlapped with the semiconductor chip 12 can be interposed between the lower electrode 10 and the upper electrode 36. Structures in which the pressure pads 30 and 32 are "overlapped" with the semiconductor chip 12 are not limited to direct contact between both but can include intervention of a plate or the like between both. Plates may be properly provided between such elements. The plates 14 and 22 can be properly added or eliminated.

Moreover, the whole configuration including the connection conductor 16 and the pressure pads 30 and 32 in FIG. 1 may be reversed upside down. In that case, the first portion 17 is provided above the pressure pads 30 and 32. Moreover, a portion corresponding to the hollow 17a of the first portion 17 may be provided in the plate 14 or the plate 34 to accommodate the lower end part 20B in that hollow and to omit the first portion 17.

While the semiconductor chip 12 may be formed of silicon, it may be formed of wide bandgap semiconductor larger in bandgap than silicon. Examples of the wide bandgap semiconductor include silicon carbide, a gallium nitride-based material, and diamond. By using the wide bandgap semiconductor, the operable temperature of the device increases. Furthermore, silicon carbide allows a MOSFET, which is a monopolar device, to have a high withstand voltage, which can achieve a high frequency and high efficiency. Notably, these modifications can also apply to semiconductor devices according to the following embodiments.

Since the semiconductor devices according to the following embodiments have much resemblance to that of Embodiment 1, their differences from that of Embodiment 1 will be mainly described.

Embodiment 2

Figure 4:
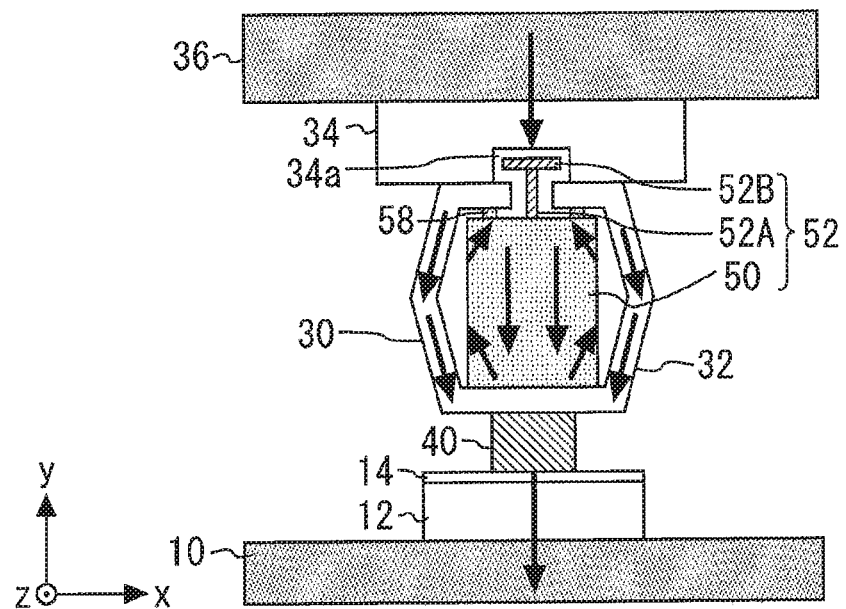
FIG. 4 is a cross-sectional view of a semiconductor device according to Embodiment 2.

FIG. 4 is a cross-sectional view of a semiconductor device according to Embodiment 2. A connection conductor 52 includes a metal block 50 provided on the inner wall lower surfaces of the pressure pad 30 and the pressure pad 32, a linear conductor 52A fixed to the metal block 50, and an upper end pert 52B connected to the linear conductor 52A. The metal block 50 is connected to the lower end of the linear conductor 52A. The upper end part 52B is connected to the upper end of the linear conductor 52A. Namely, a T-shaped structure constituted of the linear conductor 52A and the upper end part 52B is fixed to the upper surface of the metal block 50.

The metal block 50 is preferably formed, for example, of a material with excellent heat dissipation such as copper. The metal block 50 is a large metal lump. The metal block 50 according to Embodiment 2 has a width larger than the distance between the upper end part of the pressure pad 30 and the upper end part of the pressure pad 32, and is longer than a half the length of the pressure pad 30, 32.

The linear conductor 52A penetrates a gap between the upper end part of the pressure pad 30 and the upper end part of the pressure pad 32. Further, a hollow 34a is provided in the plate 34. The upper end part 52B is accommodated in this hollow 34a. In the normal state, the upper end part 52B is not in contact with the plate 34 or the pressure pads 30 and 32. Similarly to Embodiment 1, an insulating film may be formed on at least any of the lateral surface of the linear conductor 52A and the lateral surfaces of the pressure pads 30 and 32.

Springs 58 are provided on the metal block 50. The springs 58 are provided between the inner wall upper surfaces of the pressure pads 30 and 32 and the metal block 50. By the springs 58 properly maintaining the distance between the pressure pads 30 and 32 and the metal block 50, peeling-off between the components of the semiconductor device is prevented, and electric connection in the semiconductor chip 12 is secured. A plate 40 is provided on and under the pressure pads 30 and 32. The plate 40 is in contact with the upper surface of the plate 14.

Figure 5:
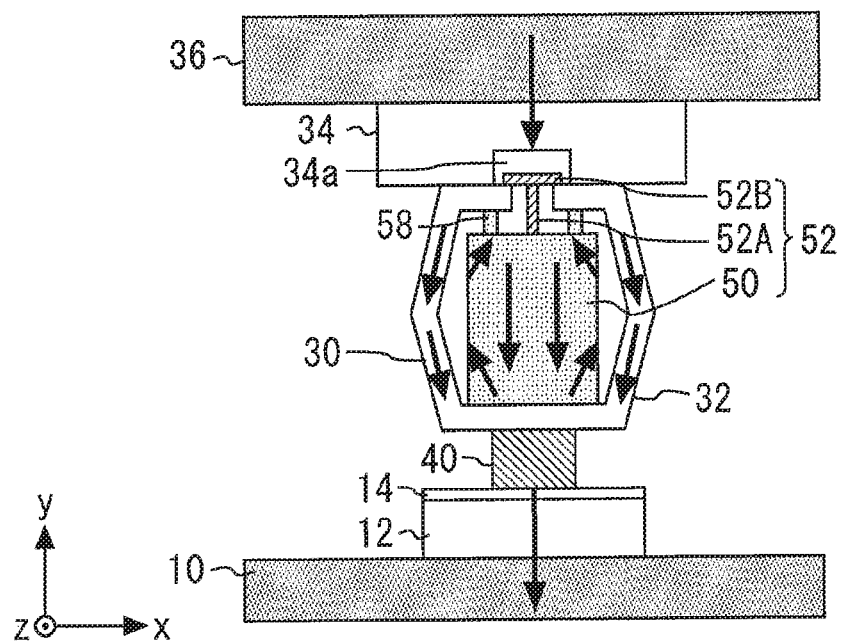
FIG. 5 is a cross-sectional view of the semiconductor device in short circuit.

FIG. 5 is a cross-sectional view of the semiconductor device in short circuit. When short circuit occurs, the distance between the lower electrode 10 and the upper electrode 36 increases, and thereby, the lower surface of the upper end part 52B comes into contact with the upper surfaces of the pressure pads 30 and 32. Thereby, short circuit currents flow not only through the pressure pads 30 and 32 but also through the connection conductor 52. Therefore, since short circuit currents flowing through the pressure pads 30 and 32 can be more reduced as compared with the case where the short circuit currents flow only through the pressure pads 30 and 32, the pressure pads 30 and 32 can be prevented from melting and breaking. Since the short circuit current is caused to flow particularly through the metal block 50, impedance of this portion can be made smaller than that in Embodiment 1. Therefore, a larger effect of melting and breaking prevention can be expected than that for the semiconductor device according to Embodiment 1.

Now, when large currents in the same directions flow through the pressure pad 30 and the pressure pad 32, attractive force occasionally arises between the pressure pads 30 and 32, so that the pressure pads 30 and 32 come into close contact with the lateral surface of the metal block 50. In order to prevent this, the metal block 50 may be extended in the directions on the front side and the backside of the view plane, and thereby, the attractive force exerted on the pressure pads 30 and 32 can be reduced.

Embodiment 3

Figure 6:
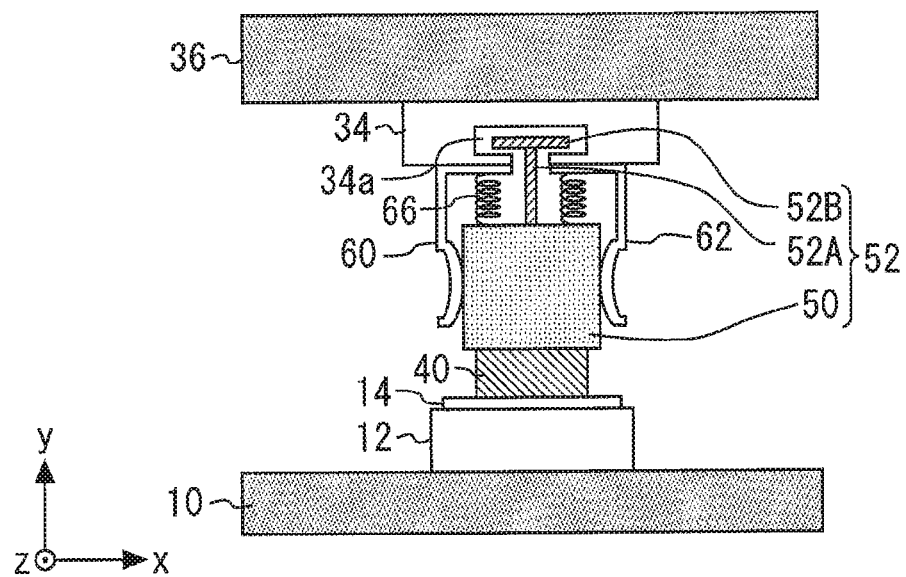
FIG. 6 is a cross-sectional view of a semiconductor device according to Embodiment 3.

FIG. 6 is a cross-sectional view of a semiconductor device according to Embodiment 3. The connection conductor 52 including the metal block 50 is placed above the plate 14. The main difference between the semiconductor device according to Embodiment 3 and the semiconductor device according to Embodiment 2 is in the shape of the pressure pads. The upper end parts of pressure pads 60 and 62 in Embodiment 3 are fixed to the plate 34. Therefore, the pressure pads 60 and 62 are mechanically and electrically connected to the upper electrode 36.

The pressure pads 60 and 62 are in contact with the metal block 50 near its lateral surface center with their inward spring forces. Although the pressure pads 60 and 62 are electrically connected to the metal block 50, they are not mechanically fixed thereto. Therefore, the pressure pads 60 and 62 slide on the lateral surface of the metal block 50 in contact therewith when the distance between the lower electrode 10 and the upper electrode 36 changes.

Springs 66 are positioned on the upper surface of the metal block 50. These springs 66 secure the degree of freedom of the distance between the lower electrode 10 and the upper electrode 36 while securing electric connections between the individual components of the semiconductor device. When short circuit currents flow through the semiconductor chip 12, repulsive force arises between the upper electrode 36 and the lower electrode 10, which makes the distance between the upper electrode 36 and the lower electrode 10 large. Accordingly to this, the pressure pads 60 and 62 slide on the lateral surface of the metal block 50, and the upper end part 52B comes into contact with the inner wall lower surface of the plate 34. Thus, a short circuit current can be caused to flow through the connection conductor 52. Notably, by extending the metal block 50 in the horizontal direction parallel to the view plane, in the direction on the front side of the view plane, or in the direction on the backside of the view plane, attractive force exerted on the pressure pad 60 and the pressure pad 62 can be adjusted.

Embodiment 4

Figure 7:
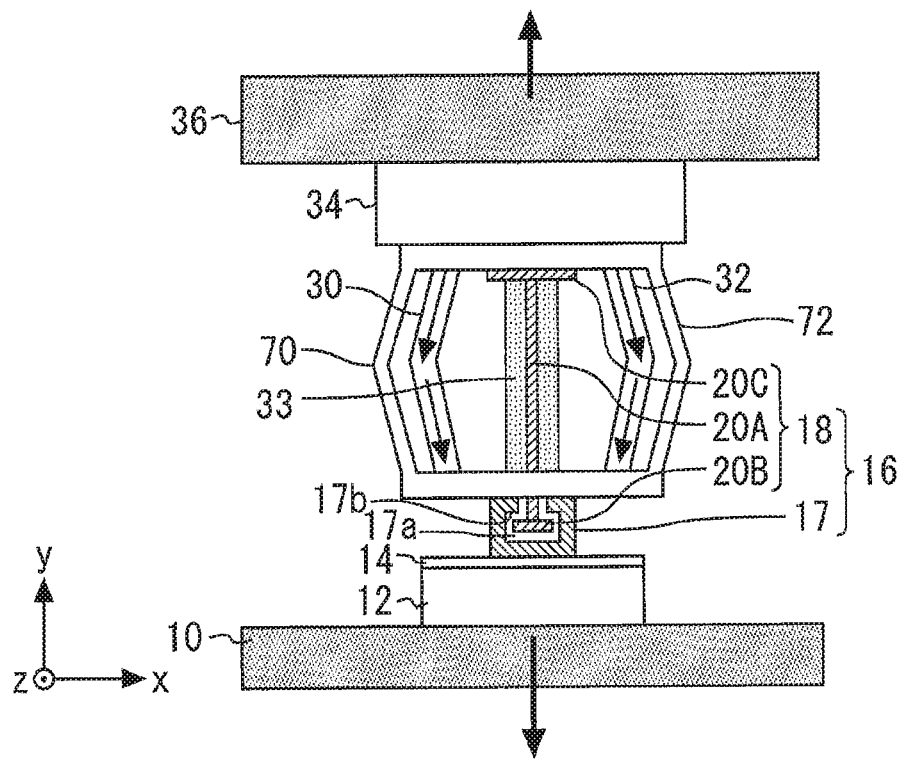
FIG. 7 is a cross-sectional view of a semiconductor device according to Embodiment 4.

FIG. 7 is a cross-sectional view of a semiconductor device according to Embodiment 4. In this semiconductor device, pressure pads 70 and 72 are provided in addition to the pressure pads 30 and 32, and thereby, a current value for each pressure pad is reduced. Since a temperature increase of each pressure pad can be suppressed by increasing the number of pressure pads, this is effective for preventing a pressure pad from melting and breaking. The number of pressure pads only has to be plural and is not limited to four. A pressure pad can be prevented from melting and breaking by providing a plurality of pressure pads in one semiconductor device to cause currents to be individually allocated to these.

Embodiment 5

Figure 8:
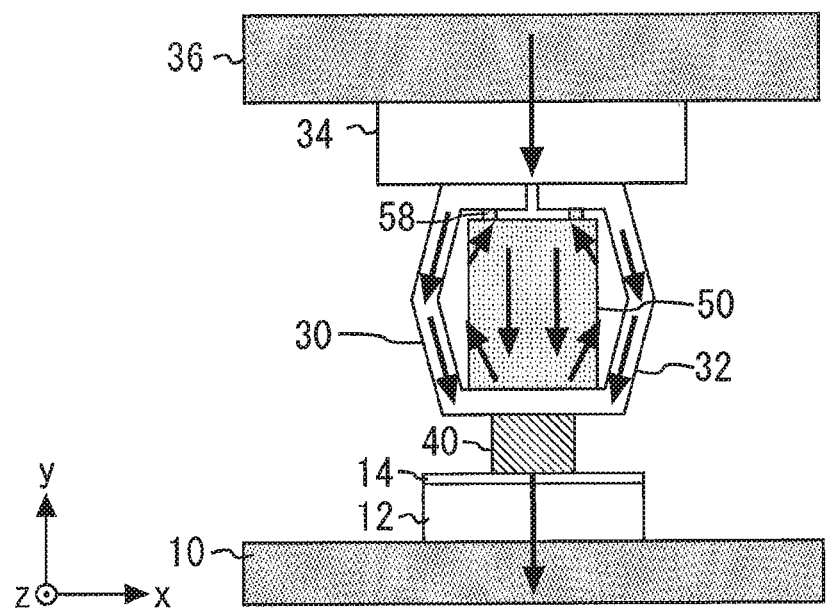
FIG. 8 is a cross-sectional view of a semiconductor device according to Embodiment 5.

FIG. 8 is a cross-sectional view of a semiconductor device according to Embodiment 5. In the semiconductor device of Embodiment 5, the linear conductor 52A, the upper end part 52B and the hollow 34a are removed from the semiconductor device in FIG. 4. The metal block 50 is provided to be overlapped with the semiconductor chip 12. The pressure pads 30 and 32 are provided between the lower electrode 10 and the upper electrode 36, and electrically connect the lower electrode 10 and the upper electrode 36 together via the semiconductor chip 12. The pressure pads 30 and 32 are provided to face each other, allowing the metal block 50 to be interposed therebetween.

When current flowing through the two pressure pads 30 and 32 is not more than a predetermined value, as shown in FIG. 8, the two pressure pads 30 and 32 are separate from the lateral surface of the metal block 50. Since the normal current is the aforementioned current "not more than the predetermined value", the normal current flows only through the pressure pads 30 and 32, not through the metal block 50.

Figure 9:
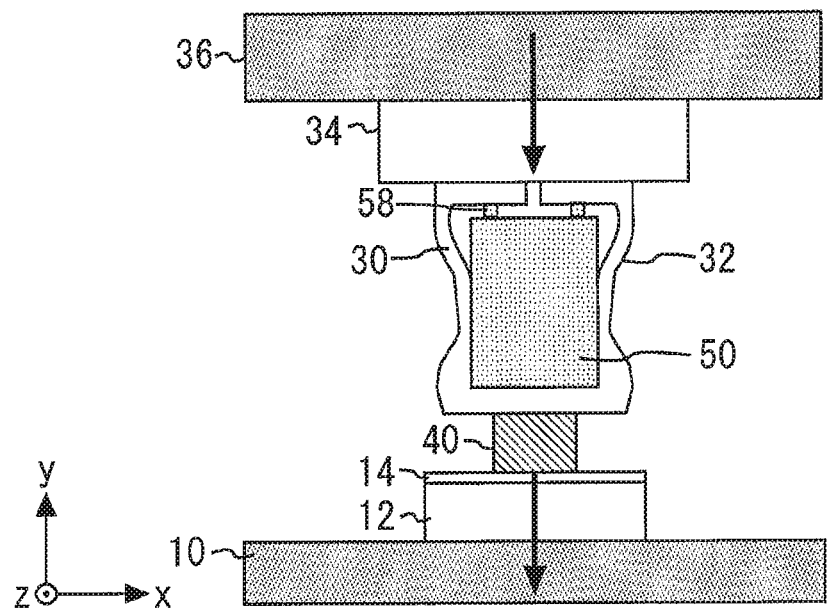
FIG. 9 is a cross-sectional view of the semiconductor device in short circuit.

FIG. 9 is a cross-sectional view of the semiconductor device in short circuit. In the case of short circuit failure of the semiconductor chip 12, currents in the same directions flow through the pressure pads 30 and 32. Then, when current flowing through the two pressure pads 30 and 32 becomes larger than the predetermined value due to the short circuit arising, large attractive force arises between the two pressure pads 30 and 32. This attractive force decreases the distance between the two pressure pads 30 and 32, and the two pressure pads 30 and 32 come into contact with the lateral surface of the metal block 50.

When the attractive force between the two pressure pads 30 and 32 is large as above, the pressure pads 30 and 32 collapse to stick to the metal block 50, and thereby, the short circuit current also flows through the metal block 50. Therefore, the pressure pads 30 and 32 can be prevented from melting and breaking. Besides, since a large heat capacity of the metal block 50 suppresses a temperature increase of the pressure pads 30 and 32, the effect of preventing melting and breaking of the pressure pads 30 and 32 can be enhanced. Notably, by extending the metal block 50 in the directions on the front side and the backside of the view plane, the attractive force exerted on the pressure pads 30 and 32 can be adjusted.

Embodiment 6

Figure 10:
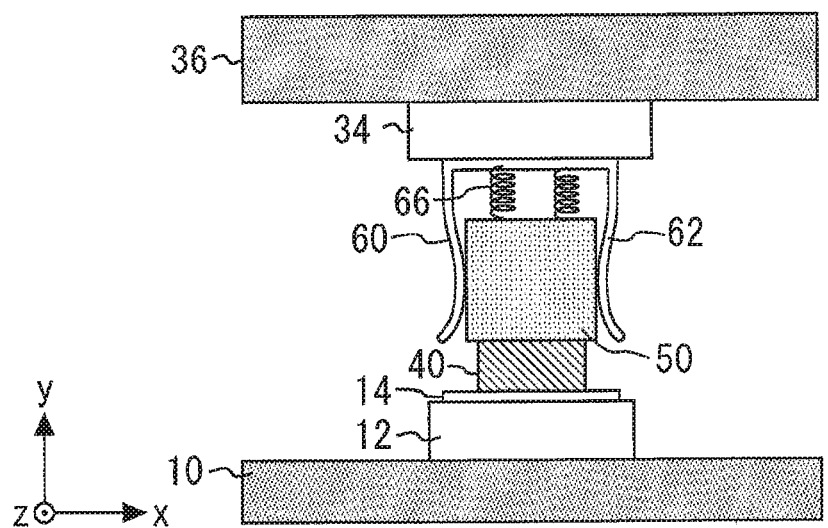
FIG. 10 is a cross-sectional view of a semiconductor device according to Embodiment 6.

FIG. 10 is a cross-sectional view of a semiconductor device according to Embodiment 6. In the semiconductor device of Embodiment 6, the linear conductor 52A, the upper end part 52B and the hollow 34a are removed from the semiconductor device in FIG. 6. The two pressure pads 60 and 62 are mechanically and electrically connected to the upper electrode 36. Further, the two pressure pads 60 and 62 are in contact with parts of the lateral surface of the metal block 50 while exerting elastic force on the lateral surface of the metal block 50. Further, the two pressure pads 60 and 62 slide on the lateral surface of the metal block 50 in contact therewith when the distance between the lower electrode 10 and the upper electrode 36 changes.

When current flowing through the two pressure pads 60 and 62 is not more than a predetermined value, as shown in FIG. 10, the contact area of the two pressure pads 60 and 62 with the lateral surface of the metal block 50 is small. Therefore, there is a certain contact resistance between the two pressure pads 60 and 62 and the lateral surface of the metal block 50.

Figure 11:
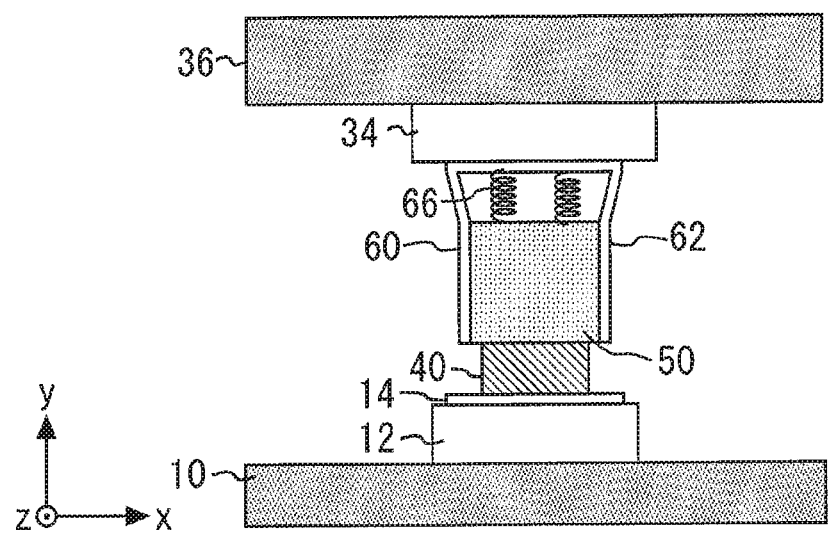
FIG. 11 is a cross-sectional view of the semiconductor device in short circuit.

FIG. 11 is a cross-sectional view of the semiconductor device in short circuit. Since attractive force is exerted between the pressure pads 60 and 62 in short circuit of the semiconductor chip 12, this attractive force causes the pressure pads 60 and 62 to stick to the lateral surface of the metal block 50. Namely, the contact area of the two pressure pads 60 and 62 with the lateral surface of the metal block 50 increases. Thereby, since a short circuit current can be caused to flow in the state where the contact resistance between the two pressure pads 60 and 62 and the lateral surface of the metal block 50 is reduced, the pressure pads 60 and 62 can be prevented from melting and breaking.

Besides, since a large heat capacity of the metal block 50 suppresses a temperature increase of the pressure pads 60 and 62, the effect of preventing melting and breaking of the pressure pads 60 and 62 can be enhanced. Notably, by extending the metal block 50 in the direction on the front side of the view plane and in the direction on the backside of the view plane, attractive force exerted between the pressure pads 60 and 62 can be adjusted.

In the inventions of Embodiments 5 and 6, the pressure pads are made thin to some extent such that the distance between the two pressure pads becomes small when current flowing through the two pressure pads becomes larger than a predetermined value, and the contact area of the two pressure pads with the lateral surface of the metal block is allowed to increase. Various modifications of those may occur as long as they do not lose these features.

Notably, the features of the aforementioned semiconductor devices according to the individual embodiments may be properly combined to enhance the effect of the present invention.

The invention claimed is:

1. A semiconductor device comprising:
   a lower electrode;
   a semiconductor chip provided on the lower electrode;
   a pressure pad provided above or below the semiconductor chip;
   an upper electrode provided on a structure in which the pressure pad is overlapped with the semiconductor chip; and
   a connection conductor that is capable of providing a new current path between the lower electrode and the upper electrode only when a distance between the lower electrode and the upper electrode becomes larger than a predetermined value, the predetermined value based on the distance between the lower electrode and the upper electrode during a short circuit of the semiconductor device, wherein
   the distance between the lower electrode and the upper electrode is capable of varying, and
   the pressure pad electrically connects the lower electrode and the upper electrode together via the semiconductor chip regardless of the distance between the lower electrode and the upper electrode.

2. The semiconductor device according to claim 1, wherein
   the connection conductor includes
      a first portion that is capable of interlockingly moving with the lower electrode, and
      a second portion that is capable of interlockingly moving with with the upper electrode,
   a lower end part of the second portion is positioned below an upper end of the first portion, and
   the lower end part is capable of coming into contact with the first portion when the distance between the lower electrode and the upper electrode becomes larger than the predetermined value.

3. The semiconductor device according to claim 2, wherein a lateral surface of the first portion is separate from a lateral surface of the second portion at all times.

4. The semiconductor device according to claim 1, wherein the connection conductor includes a metal block.

5. The semiconductor device according to claim 1, wherein
   the connection conductor includes a metal block, and
   the pressure pad is in contact with a lateral surface of the metal block, and is capable of sliding on the lateral surface of the metal block in contact therewith when the distance between the lower electrode and the upper electrode changes.

6. The semiconductor device according to claim 1, comprising a plurality of the pressure pads.

7. The semiconductor device according to claim 1, comprising a spring that is capable of exerting force which makes the distance between the lower electrode and the upper electrode small when the distance between the lower electrode and the upper electrode increases, and is capable of exerting force which makes the distance between the lower electrode and the upper electrode large when the distance between the lower electrode and the upper electrode decreases.

8. The semiconductor device according to claim 1, wherein the semiconductor chip is formed of wide bandgap semiconductor.

9. The semiconductor device according to claim 8, wherein the wide bandgap semiconductor is silicon carbide, a gallium nitride-based material or diamond.

10. A semiconductor device comprising:
    a lower electrode;
    an upper electrode provided above the lower electrode;
    a semiconductor chip provided between the lower electrode and the upper electrode;
    a metal block provided between the lower electrode and the upper electrode to be overlapped with the semiconductor chip; and
    two pressure pads provided between the lower electrode and the upper electrode, the two pressure pads are configured for electrically connecting the lower electrode and the upper electrode together via the semiconductor chip, and provided to face each other, allowing the metal block to be interposed between the two pressure pads, wherein
    when current flowing through the two pressure pads becomes larger than a predetermined value, a distance between the two pressure pads is capable of decreasing, and a contact area of the two pressure pads with a lateral surface of the metal block is capable of increasing, the predetermined value based on the distance between the lower electrode and the upper electrode during a short circuit of the semiconductor device.

11. The semiconductor device according to claim 10, wherein when the current flowing through the two pressure pads is not more than the predetermined value, the two pressure pads are capable of being separate from the lateral surface of the metal block.

12. The semiconductor device according to claim 10, wherein the two pressure pads are in contact with a part of the lateral surface of the metal block while exerting elastic force on the lateral surface of the metal block, and are capable of sliding on the lateral surface of the metal block in contact therewith when a distance between the lower electrode and the upper electrode changes.

* * * * *